United States Patent [19]

Osial et al.

[11] Patent Number: 4,521,668
[45] Date of Patent: Jun. 4, 1985

[54] METHOD OF HERMETICALLY LASER SEALING ELECTRONIC PACKAGES

[75] Inventors: Thaddeus A. Osial, Randallstown; Alexander A. Bosna, Arnold; Richard J. Kulak, Ellicott City, all of Md.

[73] Assignee: Westinghouse Electric Corp., Pittsburgh, Pa.

[21] Appl. No.: 549,860

[22] Filed: Nov. 8, 1983

[51] Int. Cl.$^3$ .............................................. B23K 27/00
[52] U.S. Cl. .............................................. 219/121 LC
[58] Field of Search ................ 219/121 LC, 121 LD, 219/121 EC, 121 ED, 121 PJ, 121 PK; 445/43, 44

[56] References Cited

U.S. PATENT DOCUMENTS 4,117,300  9/1978  Ricards .................. 219/121 LD

FOREIGN PATENT DOCUMENTS 41089  4/1981  Japan ......................... 219/121 LD
62691  5/1981  Japan ......................... 219/121 LD Primary Examiner—C. L. Albritton
Attorney, Agent, or Firm—W. G. Sutcliff

[57] ABSTRACT

A method of hermetically sealing an r.f. electronic module by laser welding the perimeter of a thin, solid cover sheet over a conventional package cover. The cover sheet perimeter seats on the top surface of the package side walls and the laser weld is made between the perimeter of the weldable cover sheet and the top surface of the package side walls. This minimizes heating of the electronic package and components contained therein during sealing and possible subsequent delidding and resealing.

3 Claims, 4 Drawing Figures

METHOD OF HERMETICALLY LASER SEALING ELECTRONIC PACKAGES

GOVERNMENT CONTRACT

The U.S. Government has rights in this invention pursuant to Contract No. DAAK10-81-C-0093 awarded by the Department of the Army.

BACKGROUND OF THE INVENTION

The present invention relates to a method of hermetically sealing electronic packages such as are used in radar systems. The electronic packages are typically box-like packages with r.f. connectors sealed through the package or module walls. Electronic components are mounted within the package which is hermetically sealed by soldering in place top and bottom cover members. Such prior art solder sealing requires heating the entire package, which is typically aluiminum, to a temperature which may adversely affect the electronic components within the package. The soldering of the cover to the package is carried out by local heating using a propane torch or soldering iron.

It is not unusual for such electronic packages to be reopened or delidded during assembly and testing, for adjustment or replacement of electronic components. If such solder sealed packages must be dissassembled by removing the soldered cover or lid, the package must be reheated to melt the solder, and the solder removed from the seal area to prevent entry of the solder into the package. Such delidding of solder covers is a time consuming and tedious operation. Furthermore, for aluminum packages a nickel/tin layer must be plated on the solder seal area to permit adherence of the solder to the aluminum package.

The electronic package or modules operate in the UHF or microwave region of the electromagnetic spectrum. In most designs it is necessary to provide electrical isolation between various components to prevent electrical coupling and possible instabilities. This is accomplished by compartmentalizing the chassis or package, and attaching a flexible conductive seal to the underside of the cover in the areas of the compartment walls. The cover is then tightly screwed onto the module to compress the seal and provide the required isolation. The present method for sealing the screw holes in the cover is by soldering discs over these holes. Electronic components are disposed with the various compartments of the package or module.

These modules require the attachment of hermetically sealed r.f. and power connectors which are connected to the electronic components within the package. The current method is to nickel/tin plate the connectors in the areas to be soldered and then solder them to the nickel/tin plated chassis using a high temperature solder (such as tin/silver which melts at 221° C.) prior to assembly of the components. After assembly, the cover may be soldered in place with the lower temperature solder without adversely affecting the connector solder joint. However, heating the connectors to such elevated temperatures can cause failures at the glass to metal seals.

The prior art solder sealing process has serious disadvantages including requiring a high degree of operator skill with accurate control of soldering parameters required. The heating requirements during normal sealing as well as during delidding subject the electronic components to possible thermal damage, and repair of leaks requires further thermal treatment.

SUMMARY OF THE INVENTION

A method has been developed for hermetically sealing r.f. electronic modules or packages. The method utilizes a solid, thin weldable cover sheet which is laser welded to the periphery of the side walls of the box-like package. This method permits use of the conventional removable cover, which in many designs serves to compartmentalize the module or package interior, while providing a cover sheet which is hermetically sealed to the package side walls with minimum of heating of the package. The laser welded cover sheet can be removed or delidded by milling away the laser weld area and discarding the cover sheet, with an inexpensive replacement cover sheet being used thereafter.

DESCRIPTION OF THE PREFERRED EMBODIMENT

Figure 1:
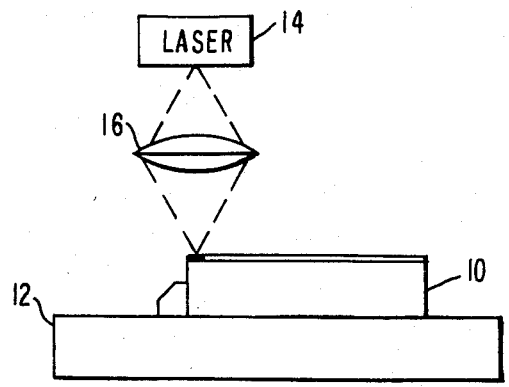
FIG. 1 is a schematic representation of the laser welding set up utilized in the present invention.

The invention can be best understood by reference to the drawings. In FIG. 1, the r.f. electronic package or module 10 is mounted on an X-Y table 12 which is driven by a programmed control system to move the package or module 10 to effect laser welding of selected portions of the package 10.

A laser 14 is disposed above the package 10 mounted on table 12, with optical beam focusing means 16 for focusing the laser output beam in a small diameter spot size on the workpiece or package 10. By way of example, a pulsed YAG laser can be used, with the focusing optics providing a 15-20 mil diameter beam spot at the workpiece. The laser utilized has a 3.7 millisecond pulse width, and was operated at 20 pulses per second at 180 walls average power, with the workpiece moved at the rate of 9 inches per minute.

Figure 2:
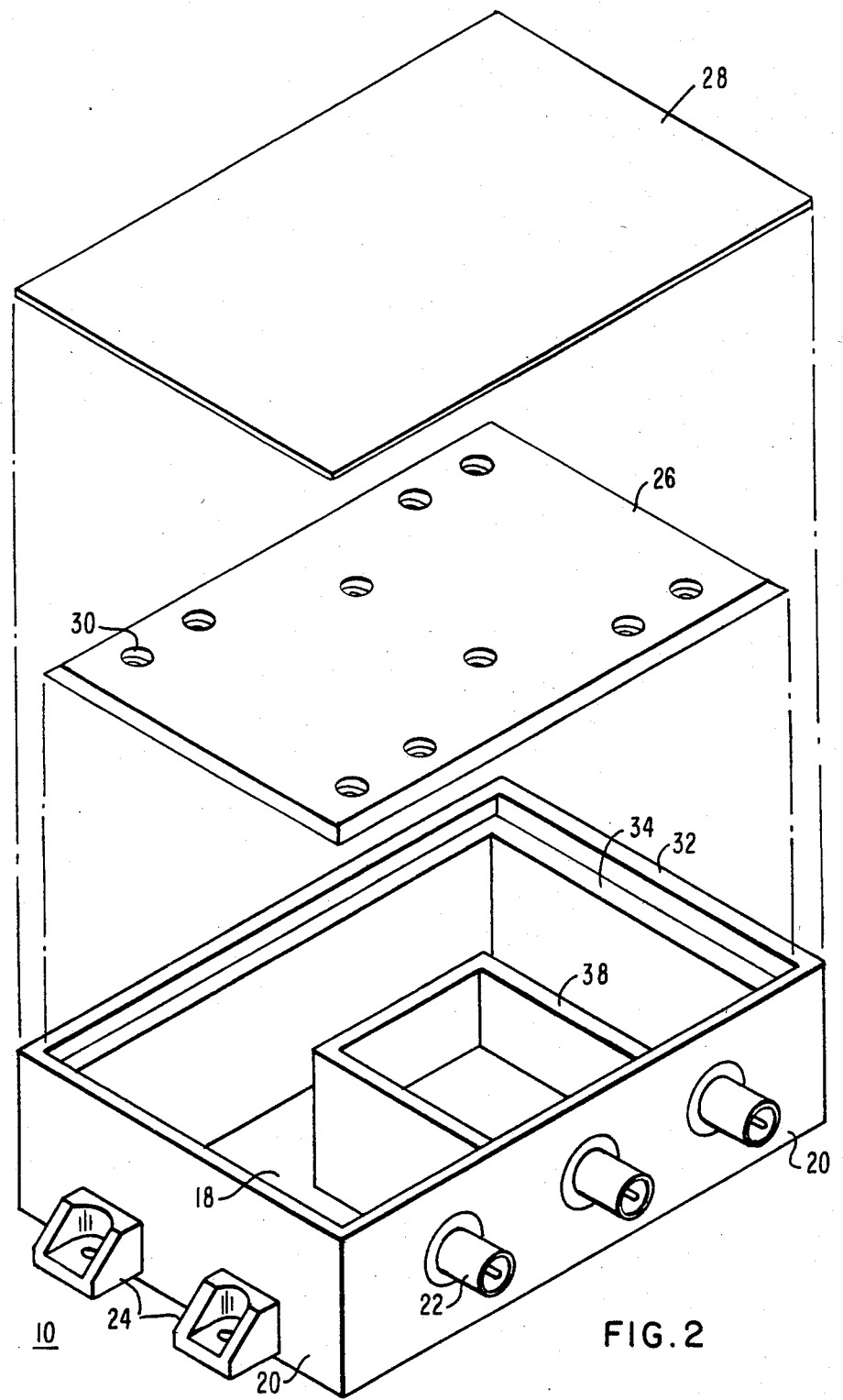
FIG. 2 is an exploded perspective view of an embodiment of an electronic package, cover, and cover sheet used in the present invention.

The electronic package or module 10 comprises a generally rectangular box-like member with a base portion 18 and four side wall portions 20 extending from the base perimeter. The base and side walls may be formed as a single member, or the base may be removable as a bottom cover for the package 10. Electric connector means 22 are hermetically sealed through the side wall portion. In the embodiment seen in FIG. 2, three such r.f. connectors 22 extend through side wall 20. Package mounting means 24 extend from the side walls external to the package.

Top cover 26 is a planar member which is removably connectable to the package via fastening means not shown, such as machine screws, which pass through cover apertures 30, to fasten to aligned threaded apertures in the top surface of the supporting side walls or inner vertical wall 38 which defines a chamber within the package or module.

Figure 4:
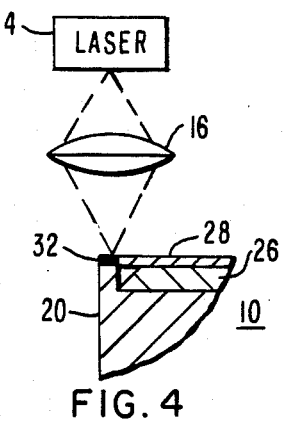
FIG. 4 is a schmetic illustration of the laser welding system with an enlarged partial view in section of a portion of the electronic package which illustrates welding of the cover sheet at its perimeter to the top surface of the package side wall.

The side wall portions 20 include a top surface perimeter portion 32, which is typically about 40 mils wide, and a recessed cover seat portion 34. the top cover 26 has a dimension such that it is termed a drop in cover, and seats on recessed cover seat portion 34. The top cover sheet or lid 28 is a thin solid sheet of weldable metal, for example 4047 aluminum alloy which is about 0.015 to 0.020 thick. The top cover sheet dimensions are such as to cover the side wall portions of the package and seating upon the side wall perimeter portion 32 which is about 0.040 inch wide, to facilitate laser welding of the cover sheet perimeter to the package as best seen in FIG. 4.

The laser welding process is automated by programming a Computerized Numerical Control (CNC) system to control the X-Y table motion to move the package under the focused laser beam, as well as to control operation of the laser.

The standard material used for electronic packages or modules is 6061 aluminum alloy, which is not weldable to itself without a filler material. Thus, the cover sheet should be weldable 4047 aluminum alloy which is directly weldable to the package. The laser weld depth of penetration is nominally 0.035 to 0.040 inch.

Figure 3:
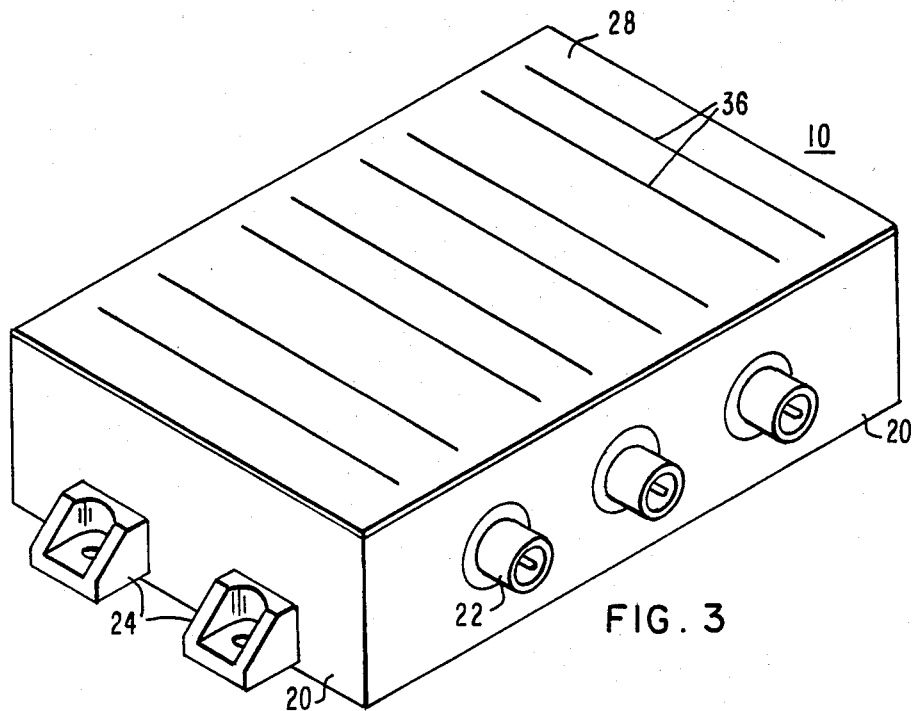
FIG. 3 is a plan view of an electronic package which has been sealed per the present invention with additional laser weld created reinforced areas on the cover sheet.

Since many electronic packages are utilized in airborne radar systems, and thus may be subject to significant pressure differentials, with the hermetically sealed package interior being at atmospheric pressure, a plurality if elongated reinforcing welds 36 are shown in FIG. 3. These reinforcing welds are made between the cover sheet 28 and the cover 26, to prevent bulging of the lid in the event of pressure loss in an aircraft. The cover 26 being relatively thicker than the cover sheet provides reinforcement for the thin cover sheet. Care is taken in making reinforcement welds 36 to avoid the apertures 30 in the cover 26.

The term delidding refers to removal of the lid or cover from the electronic package, and is accomplished by milling the thin cover sheet at the weld areas, peeling off the cover sheet, and fly cutting the membrane to remove any excess weld bead. Following repair or replacement of an electronic component within the package a new cover sheet is laser welded in place to hermetically seal the package.

The present laser welding process provides highly reliable hermetic seals, but in the event there is a small leak, it can be easily repaired by applying a paste consisting of a mixture of aluminum powder and alcohol over the leak area. After the alcohol has evaporated, the laser beam is passed over the leak area effecting a re-weld and sealing the leak. It is also possible to repair a leak by using the programmed CNC to weld a small circle around a small leak area, thereby isolating it, with the circular weld being between the cover sheet and the cover.

We claim:

1. Method of fabricating a hermetically sealed r.f. electronic module comprising a generally box-like package containing r.f. circuitry therein, which package includes side wall portions and top and bottom cover members, with hermetic electrical connectors sealed through the side walls, and r.f. electrical circuit means are disposed within the package, and wherein at least one of the top or bottom cover members is removably connectable to the package with fastener means, which method comprises:
   (a) forming a recessed cover member seating portion extending peripherally about one side wall end portion;
   (b) mounting the top cover member on the recessed cover member seating portion, and removably fastening said top cover member thereto;
   (c) disposing a sealable thin weldable cover sheet over the top cover member, with the cover sheet perimeter portions seating on the side wall end portion perimeter portions.
   (d) laser welding the cover sheet perimeter portion to the side wall end portion perimeter portion to hermetically seal the module.

2. The method set forth in claim 1, wherein a plurality of reinforcement welds are made between the cover sheet and the removable cover by laser welding selected portions of the cover sheet to the underlying removable cover.

3. The method set forth in claim 1, wherein the box-like package comprises aluminum, and the cover sheet is a weldable aluminum alloy.

* * * * *